(12) United States Patent
Kawamata et al.

(10) Patent No.: US 9,460,893 B2
(45) Date of Patent: Oct. 4, 2016

(54) SUBSTRATE PROCESSING APPARATUS

(75) Inventors: Masaya Kawamata, Miyagi (JP);
Masanobu Honda, Miyagi (JP);
Kazuhiro Kubota, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 703 days.

(21) Appl. No.: 13/542,818

(22) Filed: Jul. 6, 2012

(65) Prior Publication Data
US 2013/0014895 A1 Jan. 17, 2013

Related U.S. Application Data

(60) Provisional application No. 61/523,911, filed on Aug. 16, 2011.

(30) Foreign Application Priority Data

Jul. 8, 2011 (JP) .................... 2011-151650

(51) Int. Cl.
*C23C 16/455* (2006.01)
*H01J 37/32* (2006.01)

(52) U.S. Cl.
CPC ..... *H01J 37/32091* (2013.01); *C23C 16/4558* (2013.01); *H01J 37/3244* (2013.01)

(58) Field of Classification Search
CPC .......... H01J 37/32091; H01J 37/3244; C23C 16/4558
USPC ........................ 118/715; 156/345.33, 345.34
See application file for complete search history.

(56) References Cited

U.S. PATENT DOCUMENTS

| | | | | |
|---|---|---|---|---|
| 5,009,738 A * | 4/1991 | Gruenwald | ....... | H01L 21/67069 156/345.47 |
| 5,105,761 A * | 4/1992 | Charlet | ............... | H01J 37/3244 118/719 |
| 5,232,508 A * | 8/1993 | Arena | ..................... | C23C 16/44 118/715 |
| 5,338,363 A * | 8/1994 | Kawata | ............. | C23C 16/45512 118/715 |
| 5,574,247 A * | 11/1996 | Nishitani | ............ | C23C 16/0245 118/708 |
| 5,792,272 A * | 8/1998 | van Os | ............... | C23C 16/4405 118/723 I |
| 5,876,504 A * | 3/1999 | Fuji | ....................... | C23C 16/406 118/723 E |
| 5,958,140 A * | 9/1999 | Arami | ............... | C23C 16/45502 118/715 |
| 6,013,155 A * | 1/2000 | McMillin | .............. | C23C 16/455 118/723 I |
| 6,059,885 A * | 5/2000 | Ohashi | ............... | C23C 16/4401 118/715 |
| 6,170,428 B1 * | 1/2001 | Redeker | ................ | C23C 16/507 118/715 |
| 6,270,862 B1 * | 8/2001 | McMillin | .............. | C23C 16/455 427/569 |

(Continued)

FOREIGN PATENT DOCUMENTS

| | | |
|---|---|---|
| JP | 02-187018 A | 7/1990 |
| JP | 08-158072 A | 6/1996 |

(Continued)

*Primary Examiner* — Rudy Zervigon
(74) *Attorney, Agent, or Firm* — Pearne & Gordon LLP

(57) ABSTRACT

A substrate processing apparatus can suppress an edge gas from being diffused toward a center region of a substrate. An upper electrode 200 serving as a gas introducing unit configured to supply one kind of gas or different kinds of gases to a center region and an edge region of the substrate includes a center gas inlet section 204 having a multiple number of gas holes 212 for a center gas; and an edge gas inlet section 206 having a multiplicity of gas holes 214 for an edge gas. By providing a gas hole formation plate 230 having gas holes 232 communicating with the gas holes 214 at a bottom surface of the edge gas inlet section 206, a vertical position of edge gas discharging openings can be adjusted.

9 Claims, 10 Drawing Sheets

(56) References Cited

U.S. PATENT DOCUMENTS

| | | | | |
|---|---|---|---|---|
| 6,328,221 B1* | 12/2001 | Moore | C23C 16/45563 | 118/715 |
| 6,347,749 B1* | 2/2002 | Moore | C23C 16/45563 | 118/715 |
| 6,422,172 B1* | 7/2002 | Tanaka | C23C 16/505 | 118/723 E |
| 6,514,348 B2* | 2/2003 | Miyamoto | C23C 16/4412 | 118/50 |
| 6,531,069 B1* | 3/2003 | Srivastava | H01J 37/32623 | 118/723 R |
| 6,592,664 B1* | 7/2003 | Frey | C30B 25/105 | 117/101 |
| 6,833,052 B2* | 12/2004 | Li | C23C 16/401 | 118/715 |
| 6,872,258 B2* | 3/2005 | Park | C23C 16/45565 | 118/715 |
| 6,872,259 B2* | 3/2005 | Strang | C23C 16/45565 | 118/715 |
| 7,252,716 B2* | 8/2007 | Kim | C23C 16/4558 | 118/715 |
| 7,431,772 B2* | 10/2008 | Murugesh | C23C 16/4405 | 118/715 |
| 7,572,337 B2* | 8/2009 | Rocha-Alvarez | C23C 16/4405 | 118/715 |
| 7,699,932 B2* | 4/2010 | Miller | C23C 16/45544 | 118/715 |
| 7,806,078 B2* | 10/2010 | Yoshida | C23C 16/455 | 118/723 I |
| 8,147,614 B2* | 4/2012 | White | C23C 16/45565 | 118/715 |
| 8,252,114 B2* | 8/2012 | Vukovic | C23C 16/45563 | 118/715 |
| 8,382,939 B2* | 2/2013 | Kutney | H01J 37/3244 | 118/50 |
| 8,430,962 B2* | 4/2013 | Masuda | C23C 16/45561 | 118/663 |
| 8,539,908 B2* | 9/2013 | Takagi | C23C 16/45521 | 118/695 |
| 8,568,554 B2* | 10/2013 | Hayashi | H01J 37/3244 | 118/715 |
| 8,623,172 B2* | 1/2014 | Hayashi | H01J 37/32568 | 118/715 |
| 8,715,455 B2* | 5/2014 | Brcka | H01J 37/32357 | 118/715 |
| 8,858,754 B2* | 10/2014 | Horiguchi | H01J 37/3244 | 118/723 E |
| 2001/0047764 A1* | 12/2001 | Cook | C23C 16/44 | 118/730 |
| 2002/0144706 A1* | 10/2002 | Davis | C23C 16/4405 | 134/1.1 |
| 2002/0157792 A1* | 10/2002 | Higa | H05K 3/068 | 156/345.1 |
| 2003/0019580 A1* | 1/2003 | Strang | C23C 16/45565 | 156/345.33 |
| 2003/0205202 A1* | 11/2003 | Funaki | C23C 16/4404 | 118/723 E |
| 2004/0050496 A1* | 3/2004 | Iwai | H01J 37/20 | 156/345.51 |
| 2004/0074609 A1* | 4/2004 | Fischer et al. | | 156/914 |
| 2004/0261712 A1* | 12/2004 | Hayashi | H01J 37/3244 | 118/723 E |
| 2005/0120954 A1* | 6/2005 | Carpenter | C23C 16/52 | 118/715 |
| 2005/0251990 A1* | 11/2005 | Choi et al. | | 29/558 |
| 2005/0268856 A1* | 12/2005 | Miller | C23C 16/45544 | 118/729 |
| 2006/0137606 A1* | 6/2006 | Lee | C23C 16/45589 | 118/715 |
| 2007/0277734 A1* | 12/2007 | Lubomirsky | C23C 16/402 | 118/715 |
| 2007/0289534 A1* | 12/2007 | Lubomirsky | C23C 16/452 | 118/723 R |
| 2008/0110400 A1* | 5/2008 | Satou | H01J 37/32449 | 118/723 VE |
| 2008/0115728 A1* | 5/2008 | Matsuda | H01J 37/32009 | 118/723 R |
| 2008/0185104 A1* | 8/2008 | Brcka | H01J 37/32357 | 156/345.29 |
| 2009/0221149 A1* | 9/2009 | Hammond, IV | H01J 37/32449 | 438/706 |
| 2009/0246374 A1* | 10/2009 | Vukovic | C23C 16/45587 | 427/255.28 |
| 2010/0043975 A1* | 2/2010 | Hayashi | H01J 37/3244 | 156/345.33 |
| 2010/0119727 A1* | 5/2010 | Takagi | C23C 16/45521 | 427/532 |
| 2010/0243166 A1* | 9/2010 | Hayashi | H01J 37/32568 | 156/345.34 |
| 2010/0243167 A1* | 9/2010 | Hayashi | H01J 37/32568 | 156/345.43 |
| 2011/0203735 A1* | 8/2011 | Seo | H01J 37/3244 | 156/345.34 |
| 2011/0226181 A1* | 9/2011 | Yamamoto | C23C 16/16 | 118/724 |
| 2012/0073501 A1* | 3/2012 | Lubomirsky | C23C 16/401 | 118/723 E |
| 2013/0156940 A1* | 6/2013 | Wu | C23C 16/52 | 427/9 |
| 2013/0264015 A1* | 10/2013 | Fang | H01J 37/32642 | 156/345.48 |
| 2013/0295297 A1* | 11/2013 | Chou | C23C 16/5096 | 427/569 |

FOREIGN PATENT DOCUMENTS

| | | |
|---|---|---|
| JP | 09-045624 A | 2/1997 |
| JP | 10-064831 A | 3/1998 |
| JP | 10-064888 A | 3/1998 |
| JP | 2003-309075 A | 10/2003 |

* cited by examiner

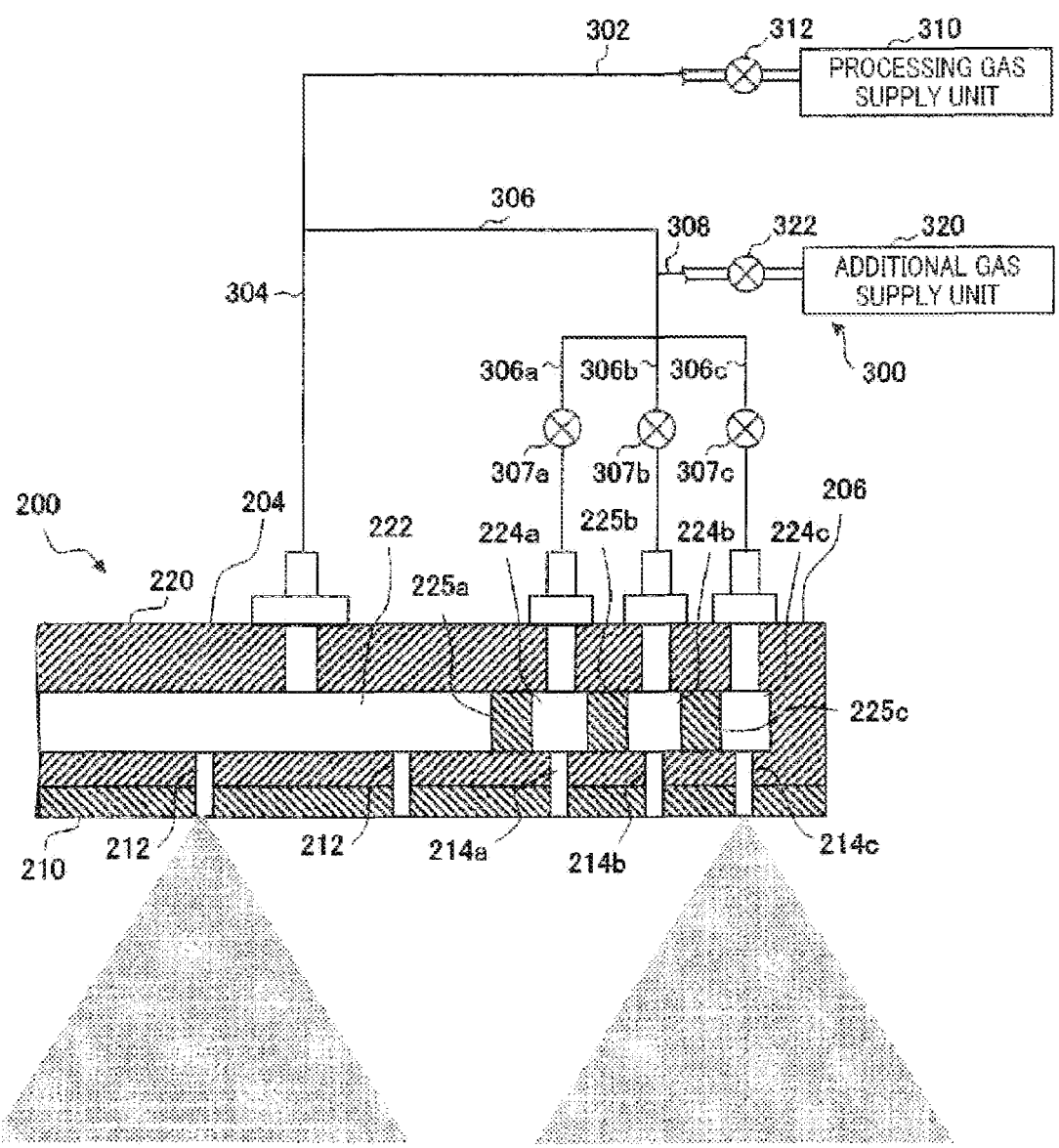

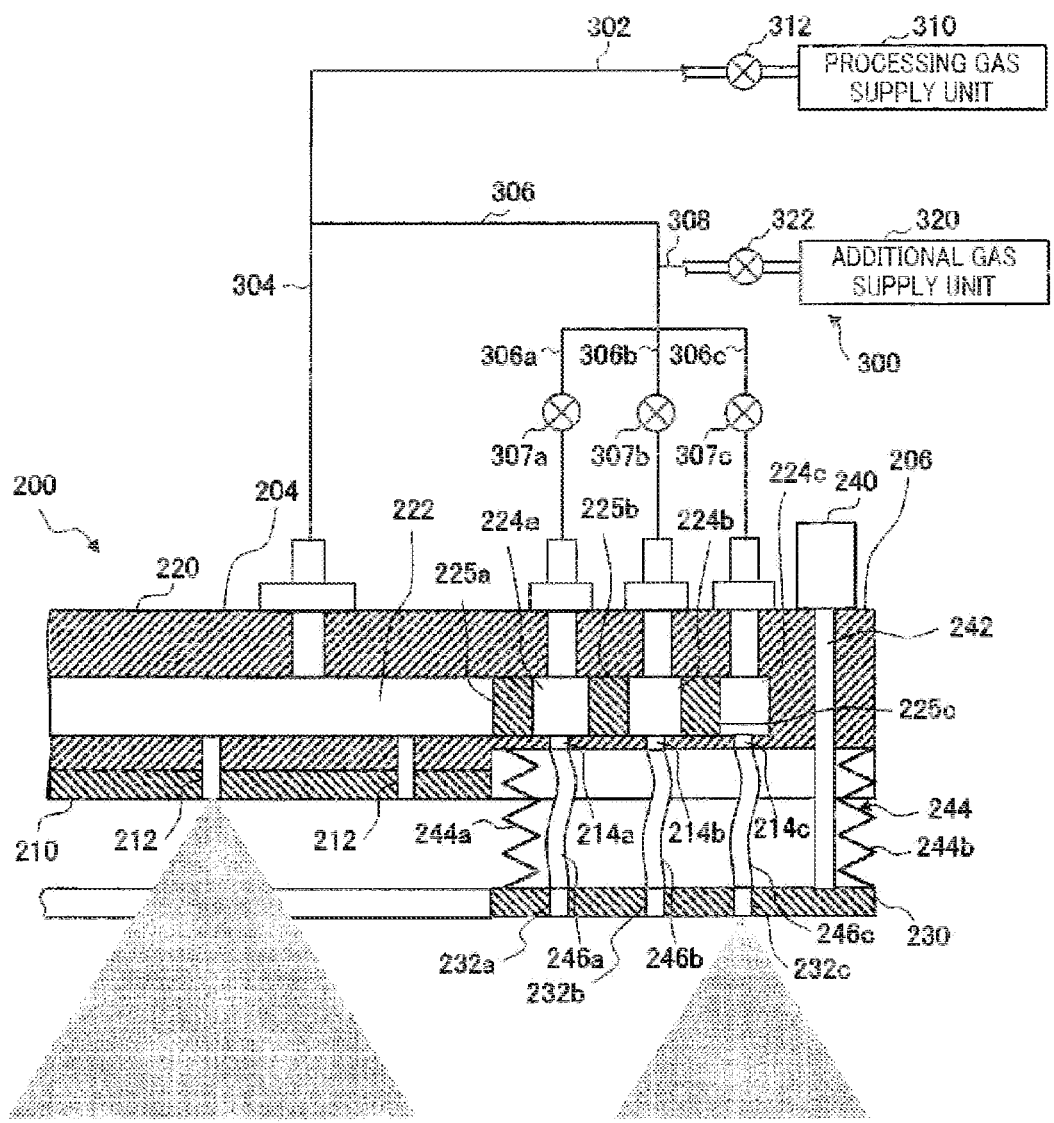

SUBSTRATE PROCESSING APPARATUS

CROSS-REFERENCE TO RELATED APPLICATION

This application claims the benefit of Japanese Patent Application No. 2011-151650 filed on Jul. 8, 2011 and U.S. Provisional Application Ser. No. 61/523,911 filed on Aug. 16, 2011, the entire disclosures of which are incorporated herein by reference.

FIELD OF THE INVENTION

The present disclosure relates to a substrate processing apparatus that performs a required process on a processing target substrate such as a semiconductor wafer, a liquid crystal substrate, or a solar cell substrate, which is provided within a processing chamber while supplying a gas to the substrate.

BACKGROUND OF THE INVENTION

As one of this kind of substrate processing apparatuses, there is known a parallel place type plasma processing apparatus in which a lower electrode and an upper electrode are arranged in parallel to each other in a processing chamber. In this apparatus, the lower electrode also serves as a mounting table for mounting thereon a processing target substrate (hereinafter, simply referred to as a "substrate") such as a semiconductor wafer, and the upper electrode serves as a shower head for discharging a gas toward the substrate. This plasma processing apparatus is configured to generate plasma by applying a high frequency power between the upper and lower electrodes after supplying a gas onto the substrate from the shower head, and is configured to perform a certain process such as a film forming process or an etching process by the plasma.

As for such a plasma processing apparatus, in order to improve uniformity of the substrate process in a surface of the substrate, it has been proposed to partition an inside of the shower head into plural gas rooms and connect gas supply lines to the gas rooms, respectively (see, for example, Patent Documents 1 and 2). By way of example, with this configuration, by discharging a gas onto the substrate from gas holes in a vicinity of a center portion of the substrate (center gas holes) and gas holes in a vicinity of an edge portion of the substrate (edge gas holes), gas concentrations in the surface of the substrate can be locally adjusted. Accordingly, the uniformity of the substrate process such as etching process in she surface of the substrate can be improved.

Patent Document 1: Japanese Patent Laid-open Publication No. H08-158072

Patent Document 2: Japanese Patent Laid-open Publication No. H09-045624

Patent Document 3: Japanese Patent Laid-open Publication No. H10-064888

The gases discharged from the respective gas holes of the shower head are gradually diffused downward. Accordingly, like Patent Documents 1 and 2, if the gas is discharged from the center gas holes and the edge gas holes, the gas discharged from the edge gas holes may be diffused to the central portion of the substrate depending on the positions of the edge gas holes. In such a case, the process on the edge portion of the substrate may not be controlled accurately.

By way of example, in Patent Documents 1 and 2, this problem is not particularly mentioned, and the center gas holes and the edge gas holes are uniformly arranged, and discharging openings of the center and edge gas holes are formed on the same flat plane. Accordingly, as the distance between the discharging openings of the edge gas holes and the substrate increases, the diffusing range of the gas discharged from the edge gas holes also becomes increased, and the influence on the process on the central portion of the substrate is also increased. As a result, controllability of the process on the edge portion of the substrate is deteriorated.

Further, in Patent Document 3, it is described that a thickness of a central portion of a gas diffusion plate having gas holes is set to be smaller than a thickness of an edge portion of the gas diffusion plate in order to improve heating efficiency of the gas diffusion plate. With this configuration, since the positions of gas holes on the edge portion thereof are located at positions lower than those of the gas holes provided on the central portion thereof, diffusion of a gas discharged from the gas holes provided on the edge portion may be suppressed.

Patent Document 3, however, does not describe the diffusion of the gas discharged from the gas holes provided on the edge portion. Furthermore, Patent Document 3 is mainly focused on improving the heating efficiency of the gas diffusion plate.

Accordingly, in order to obtain uniform mass of the gas diffusion plate over the central portion and the edge portion of the gas diffusion plate even when the thickness of the central portion of the gas diffusion plate is set to be small, the gas holes on the edge portion are set to be larger than the gas holes on the center portion. As a consequence, the diffusing range of the gas discharged from the gas holes on the edge portion is more increased. Accordingly, the influence on the process on the central portion of the substrate is increased.

BRIEF SUMMARY OF THE INVENTION

In view of the foregoing problems, illustrative embodiments provide a substrate processing apparatus capable of suppressing a gas discharged from an edge gas holes from being diffused to the central portion of the substrate in a processing chamber when gases are supplied from a center gas holes and the edge gas holes, respectively.

In accordance with one aspect of an illustrative embodiment, there is provided a substrate processing apparatus for performing a process on a substrate disposed within a processing chamber by supplying a gas to the substrate. The substrate processing apparatus includes a gas introducing unit configured to supply one kind of gas or different kinds of gases to a center region and an edge region of the substrate. Further, the gas introducing unit includes a center gas inlet section having a multiple number of gas holes for a center gas to be supplied toward the center region of the substrate; an edge gas inlet section having a multiple number of gas holes for an edge gas to be supplied toward the edge region of the substrate and surrounding the center gas inlet section; and an edge gas discharging position adjusting unit configured to adjust a horizontal position or a vertical position of edge gas discharging openings from which the edge gas is discharged through the gas holes of the edge gas inlet section.

With this configuration, by adjusting the horizontal position or the vertical position of the edge gas discharging openings through the edge gas discharging position adjusting unit, it is possible to suppress the diffusion of the edge gas toward the central portion of the wafer W. Accordingly, controllability of a process on the edge region of the substrate by the edge gas can be improved.

Further, the edge gas discharging position adjusting unit may be configured to adjust a vertical position of the edge gas discharging openings by providing a gas hole formation plate having gas holes communicating with the gas holes of the edge gas inlet section at a bottom surface of the edge gas inlet section. With this configuration, by adjusting the vertical position of the edge gas discharging openings, a distance between the edge gas discharging openings and the substrate can be decreased. Accordingly, a diffusing range of the edge gas can be reduced, so that diffusion of the edge gas toward the central portion of the substrate can be suppressed.

In this case, the gas hole formation plate may be detachable provided at the bottom surface of the edge gas inlet section, and the vertical position of the edge gas discharging openings may be adjusted by varying a thickness of the gas hole formation plate. Further, the gas hole formation plate may be provided at the bottom surface of the edge gas inlet section to be vertically movable, and the vertical position of the edge gas discharging openings may be adjusted by vertically moving the gas hole formation plate.

The edge gas discharging position adjusting unit may include a multiple number of rows of gas holes annularly arranged in the edge gas inlet seer ion from the inner side of the edge gas inlet section toward the outer side thereof, and the horizontal position of the edge gas discharging openings may be adjusted by selecting a row of the gas holes. With this configuration, by selecting the row of gas holes for discharging the edge gas, the edge gas can be discharged from a more outer position. Accordingly, diffusion of the edge gas toward the central portion of the substrate can be suppressed, so that controllability of a process on the edge region of the substrate by the edge gas can be improved.

In accordance with another aspect of the illustrative embodiment, there is provided a substrate processing apparatus for performing a process on a substrate mounted on a mounting table within a processing chamber by supplying a gas to the substrate. The substrate processing apparatus includes a gas introducing unit configured to supply one kind of gas or different kinds of gases to a center region and an edge region of the substrate. Further, the gas introducing unit includes a center gas inlet section having a multiple number of gas holes for a center gas to be supplied toward the center region of the substrate; an edge gas inlet section having a multiple number of gas holes for an edge gas to be supplied toward the edge region of the substrate and surrounding the center gas inlet section; and an edge gas discharging position adjusting unit configured to adjust both a horizontal position and a vertical position of edge gas discharging openings from which the edge gas is discharged through the gas holes of the edge gas inlet section.

With this configuration, by adjusting both the horizontal position and the vertical position of the edge gas discharging openings through the edge gas discharging position adjusting unit, diffusion of the edge gas toward the central portion of the substrate can be suppressed. Consequently, controllability of a process on the edge region of the substrate by the edge gas can be improved.

The edge gas discharging position adjusting unit may include a multiple number of rows of gas holes annularly arranged in the edge gas inlet section from the inner side of the edge gas inlet section toward the outer side thereof, and may be configured to supply the edge gas by selecting a row of the gas holes. The edge gas discharging position adjusting unit may also include a gas hole formation plate having gas holes respectively communicating with the gas holes of the edge gas inlet section. Further, the gas hole formation plate may be provided at a bottom surface of the edge gas inlet section, and the edge gas discharging position adjusting unit may be configured to adjust both a vertical position and a horizontal position of the edge gas discharging openings.

In this case, the gas hole formation plate may be detachably provided at the bottom surface of the edge gas inlet section, and the vertical position of the edge gas discharging openings may be adjusted by varying a thickness of the gas hole formation plate. Further, the gas hole formation plate may be provided at the bottom surface of the edge gas inlet section to be vertically movable, and the vertical position of the edge gas discharging openings may be adjusted by vertically moving the gas hole formation plate. The diameter of the gas hole for the edge gas may be smaller than the diameter of the gas hole for the center gas.

In accordance with the illustrative embodiment, when supplying gases into the processing chamber from the gas holes for the center gas and the gas holes for the edge gas independently, respectively, by adjusting the horizontal position and/or the vertical position of the edge gas discharging openings, the edge gas can be suppressed from being diffused toward the center region of the substrate. Accordingly, controllability of a process on the edge region of the substrate by the edge gas can be improved.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which;

FIG. 9 is a cross sectional view schematically illustrating a configuration of an upper electrode of a substrate processing apparatus in accordance with a second illustrative embodiment;

FIG. 12 is a cross sectional view illustrating another modification example of the upper electrode shown in FIG. 9.

DETAILED DESCRIPTION OF THE INVENTION

Figure 1:
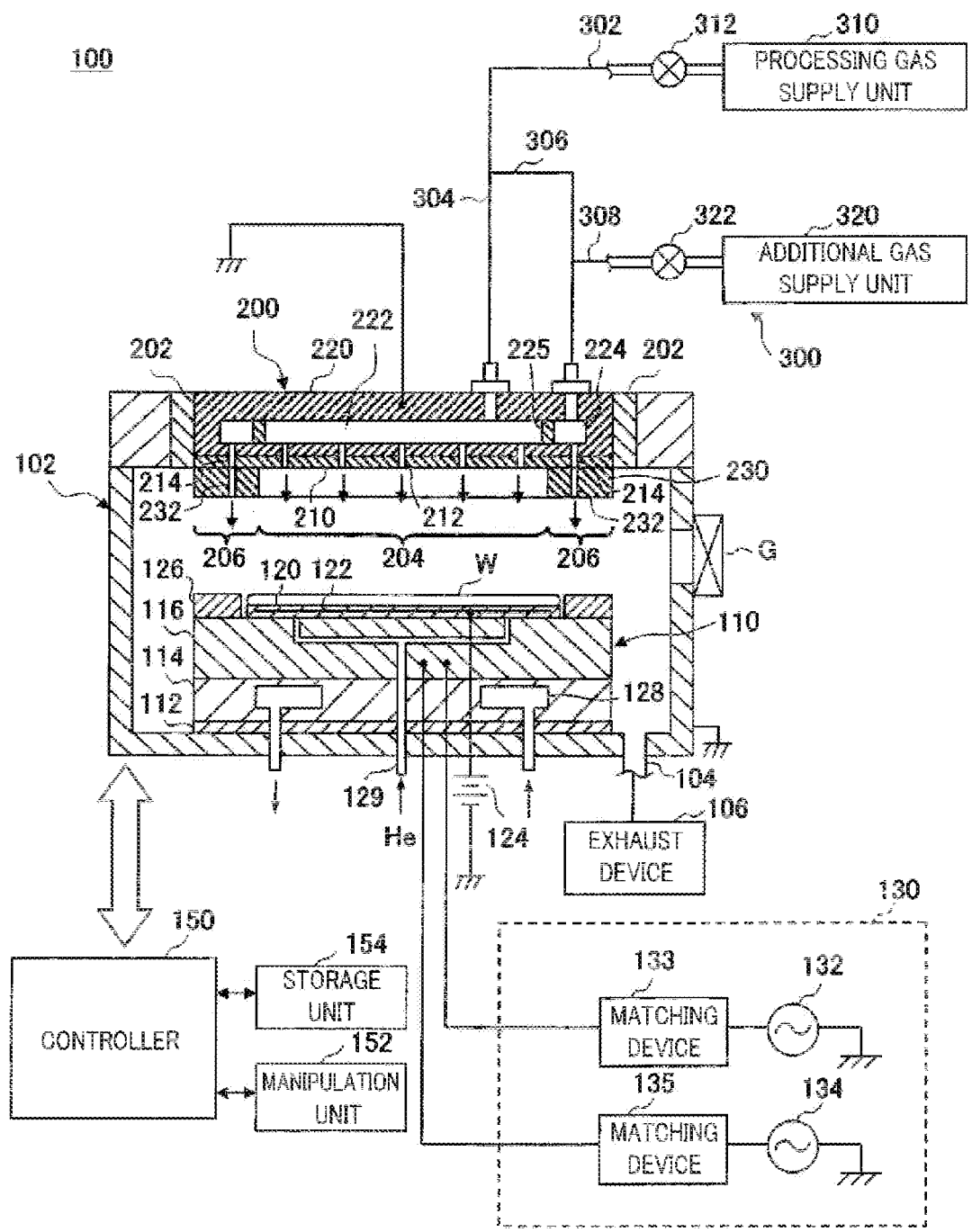
FIG. 1 is a cross sectional view schematically illustrating a configuration of a substrate processing apparatus in accordance with a first illustrative embodiment.

Hereinafter, illustrative embodiments will be described in detail with reference to the accompanying drawings. Throughout the specification and she drawings, parts having substantially same functions and configurations will be assigned same reference numerals, and redundant description will be omitted.

First Illustrative Embodiment

A substrate processing apparatus in accordance with a first illustrative embodiment will be described with reference to the accompanying drawings. By way of example, the first illustrative embodiment is described for a capacitively coupled substrate processing apparatus having a parallel plate electrode structure in which an upper electrode and a lower electrode (susceptor) are arranged in a processing chamber to face each other and a processing gas is introduced into the processing chamber from the upper electrode. FIG. 1 is a cross sectional view schematically illustrating a configuration of a substrate processing apparatus 100 in accordance with the first illustrative embodiment.

As illustrated in FIG. 1, the substrate processing apparatus 100 includes a substantially cylindrical processing chamber 102 made of a conductive material such as aluminum. The processing chamber 102 is electrically grounded. A mounting table 110 for mounting thereon a substrate, e.g., a semiconductor wafer (hereinafter, simply referred to as a "wafer W") is provided within the processing chamber 102.

The mounting table 110 has a substantially columnar shape and includes a susceptor 116 serving as the lower electrode. The susceptor 116 is supported on a cylindrical susceptor supporting table 114 via an insulating plate 112 made of e.g., a ceramic. The susceptor supporting table 114 is disposed at a bottom portion of the processing chamber 102.

On a top surface of the susceptor 116, there is provided an electrostatic chuck 220 that attracts and holds a wafer W by an electrostatic force. The electrostatic chuck 120 includes an electrode 122 made of a conductive film and embedded in a pair of insulating layers or insulating sheets. The electrode 122 is electrically connected to a DC power supply 124. If a DC voltage is applied to the electrode 122 from the DC power supply 124, an electrostatic force such as a Coulomb force is generated in a top surface of the electrostatic chuck 120, and the wafer W is attracted and held on the electrostatic chuck 120 by the electrostatic force.

A focus ring 126 is disposed on the susceptor 116 to surround the wafer W mounted on the electrostatic chuck 120. The focus ring 126 is made of a conductive material (e.g., silicon).

A temperature control path 128 is formed within the susceptor supporting table 114 along the circumference of the susceptor supporting table 114. A temperature control medium (e.g., cooling water) is supplied into and circulated in the temperature control path 128 from a non-illustrated temperature control unit. The temperature of the wafer W on the susceptor 116 can be adjusted by the temperature of the temperature control medium.

Further, a heat transfer gas (e.g., a He gas) from a non-illustrated heat transfer gas supply unit is supplied between the top surface of the electrostatic chuck 120 and a rear surface of the wafer W from a heat transfer gas supply line 129.

A power supply device 130 that supplies dual frequency powers is connected to the susceptor 116 serving as the lower electrode. The power supply device 130 includes a first high frequency power supply 132 configured to supply a first high frequency power of a first frequency (a high frequency power for plasma generation); and a second high frequency power supply 134 configured to supply a second high frequency power of a second frequency (a high frequency power for bias voltage generation). The first and second high frequency power supplies 132 and 134 are electrically connected with the susceptor 116 via first and second matching devices 133 and 135, respectively.

The first and second matching devices 133 and 135 are configured to match a load impedance to internal (or output) impedances of the first and second high frequency power supplies 132 and 134, respectively. When plasma is generated within the processing chamber 102, the first and second matching devices 133 and 135 serve to make the internal impedances of the first and second high frequency power supplies 132 and 134 and the load impedance be apparently matched to each other.

The first high frequency power supply 132 outputs a high frequency power of a frequency higher than or equal to, e.g., about 27 MHz (e.g., about 40 MHz). The second high frequency power supply 134 outputs a high frequency power of a frequency lower than or equal to, e.g., about 13.56 MHz (e.g., about 2 MHz).

An upper electrode 200 is provided at a top portion of the processing chamber 102 to face the susceptor 116 as the lower electrode in parallel. The upper electrode 200 may be electrically grounded, as shown in FIG. 1, or may be connected with a non-illustrated variable DC power supply, so that a DC current may be applied to the upper electrode 200.

The upper electrode 200 is configured to serve as a gas introducing unit (shower head) capable of introducing one kind of gas or different kinds of gases toward a central region and an edge region of the wafer W. This upper electrode 200 includes a center gas inlet section 204 having a multiple number of gas holes 212 through which center gases are supplied toward the center region of the wafer W; and an annular edge gas inlet section 206 having a multiplicity of gas holes 214 through which edge gases are supplied toward the edge region of the wafer W.

In accordance with the present illustrative embodiment, in the upper electrode 200, there is provided an edge gas discharging position adjusting unit for adjusting positions of the edge gas discharging openings in order to suppress diffusion of the edge gas toward the central portion of the wafer W. Here, the edge gas is discharged through the gas holes 214 of the edge gas inlet section 206. By way of example, in FIG. 1, as the edge gas discharging position adjusting unit, a gas hole formation plate 230 having gas holes 232 communicating with the gas holes 214 individually is provided at a bottom surface of the edge gas inlet section 206. A more detailed configuration of the upper electrode 200 including such an edge gas discharging position adjusting unit will be explained later.

An exhaust port 104 is formed at a bottom of the processing chamber 102, and by evacuating the processing chamber 102 through an exhaust device 106 connected to the exhaust port 104, the inside of the processing chamber 102 can be maintained at a certain vacuum level. A gate valve G is provided at a sidewall of the processing chamber 102. After opening the gate valve G, the wafer W can be loaded into or unloaded from the processing chamber 102.

The substrate processing apparatus 100 includes a controller 150 that controls the overall operation of the apparatus. The controller 150 is connected with a manipulation unit 152 that includes a keyboard through which an operator inputs commands to manage the substrate processing apparatus 100, a display that visually displays an operational status of the substrate processing apparatus 100, and so forth.

The controller 150 is also connected with a storage unit 154 that stores therein programs for implementing various processes performed in the substrate processing apparatus 100 under the control of the controller 150; or processing conditions (recipes) necessary for executing the programs.

By way of example, the storage unit 154 stores first and second processing conditions (recipes) to be described later. The processing conditions include multiple parameter values such as control parameters for controlling each component of the substrate processing apparatus 100, setup parameters, and so forth. For example, each processing condition may include parameter values such as a flow rate ratio of processing gases, an internal pressure of the processing chamber, a high frequency power, and so forth.

Further, these programs and the processing conditions may be stored in a hard disk or a semiconductor memory, or may be set in a certain area of the storage unit 154 while stored in a computer-readable portable storage medium such as a CD-ROM or a DVD.

The controller 150 reads out a necessary program or processing conditions from the storage unit 154 in response to, e.g., an instruction from the manipulation unit 152, and controls each component of the substrate processing apparatus 100, thereby implementing a required process in the substrate processing apparatus 100. The processing conditions can be edited through the manipulation unit 152.

(Configuration Example of Upper Electrode as Gas Introducing Unit)

Here, a configuration example of the upper electrode 200 in accordance with the first illustrative embodiment will be explained. The upper electrode 200 is provided at a ceiling portion of the processing chamber 102 via a shield ring 202 that covers a periphery portion of the upper electrode 200.

Here, the upper electrode 200 is configured as a gas introducing unit capable of introducing one kind of gas or different kinds of gases toward the center region of the wafer W mounted on the mounting table 110 and toward the edge region of the wafer W around she center region individually.

To elaborate, the upper electrode 200 includes the center gas inlet section 204 having a substantially circular plate shape and the annular edge gas inlet section 206 surrounding the center gas inlet section 204. The center gas inlet section 204 has the multiple number of gas holes 212 through which the center gases are supplied toward the center region of the wafer W, and the edge gas inlet section 206 has the multiplicity of gas holes 214 through which the edge gases are supplied toward the edge region of the wafer W.

The center gas inlet section 204 and the edge gas inlet section 206 may be formed as a single body or as separate bodies. The present illustrative embodiment is described for the example when the center gas inlet section 204 and the edge gas inlet section 206 are formed as a single body as shown in FIG. 1.

When the center gas inlet section 204 and the edge gas inlet section 206 are formed as a single body, a substantially circular plate-shaped electrode plate 210 is provided over the center gas inlet section 204 and the edge gas inlet section 206, and the electrode plate 210 is detachably supported on an electrode supporting member 220 as shown in FIG. 1. In this configuration, the electrode supporting member 220 is made of, but not limited to, a metal such as aluminum, and the electrode plate 210 is made of, but not limited to, a silicon-containing material such as quartz ($SiO_2$), SiC or SiN.

A substantially circular plate-shaped space is formed within the electrode supporting member 220. This space is divided by an annular partition wall member 225 into a substantially circular plate-shaped center buffer room 222 into which the center gas is supplied; and an annular edge buffer room 224 into which the edge gas is supplied. The center gas and the edge gas discharged from a gas supply device 300 are individually supplied into the buffer rooms 222 and 224, respectively.

The gas holes 212 for the center gas are formed in the center gas inlet section 204 to be extended from the center buffer room 222 to a bottom surface of the electrode plate 210. The gas holes 212 for the center gas are arranged to discharge the gas toward the center region of the wafer W.

The gas holes 214 for the edge gas are formed in the edge gas inlet section 206 to be extended from the edge buffer room 224 to the bottom surface of the electrode plate 210. The gas holes 214 for the edge gas are arranged to discharge the gas toward the edge region of the wafer W.

With this configuration, the center gas and the edge gas supplied from the gas supply device 300 are supplied into the center buffer room 222 and the edge buffer room 224, respectively, and diffused therein. The center gas and the edge gas are discharged toward the center region and the edge region of the wafer W through the gas holes 212 and the gas holes 214, respectively. In the first present illustrative embodiment, positions of the edge gas discharging openings of the gas holes 214 for the edge gas are adjustable, as will be described in detail later.

Further, these buffer rooms 222 and 224 may be formed by dividing the circular-plated shaped space by the annular partition wall member 225, as depicted in FIG. 1, or may be formed as separate spaces without providing the annular partition wall member 225. By way of example, when the center gas inlet section 204 and the edge gas inlet section 206 are formed as separate bodies, the buffer rooms 222 and 224 may be formed within the center gas inlet section 204 and the edge gas inlet section 206, respectively. Further, in FIG. 1, although a first electrode plate provided under the center gas inlet section 204 and a second electrode plate provided under the edge gas inlet section 206 are formed of the single electrode plate 210, the illustrative embodiment is not limited thereto. For example, when the center gas inlet section 204 and the edge gas inlet section 206 are formed as a single body as well as when the center gas inlet section 204 and the edge gas inlet section 206 are formed as separate bodies, the first electrode plate provided under the center gas inlet section 204 and the second electrode place provided under the edge gas inlet section 206 may be formed as separate bodies.

(Gas Supply Device)

Now, the gas supply device 300 will be explained with reference to the accompanying drawings. FIG. 1 illustrates an example when a processing gas from a processing gas supply unit 310 is split into a center gas and an edge gas, and an additional gas can be added to she edge gas. With this configuration, it is possible to supply one kind of gas or different kinds of gases to the center gas inlet section 204 and the edge gas inlet section 206 individually.

The gas supply device 300 shown in FIG. 1 includes the processing gas supply unit 310 configured to supply a processing gas for performing a certain process such as a film forming process or an etching process on the wafer W; and an additional gas supply unit 320 configured to supply an additional gas. The processing gas supply unit 310 is connected with a processing gas supply line 302, and an opening/closing valve 312 for turning on and off the supply of the processing gas from the processing gas supply unit 310 is provided on the processing gas supply line 302.

The processing gas supply line 302 is branched into a first branch line 304 and a second branch line 306. With this configuration, the processing gas flowing in the processing gas supply line 302 is branched into the center gas flowing in the first branch line 304 and the edge gas flowing in the second branch line 306. The first and second branch lines 304 and 306 are connected to the center buffer room 222 and the edge buffer room 224 of the upper electrode 200, respectively.

An additional gas supply line 308 for supplying the additional gas from the additional gas supply unit 320 is connected to the second branch line 306. An opening/closing valve 322 for turning on and off the supply of the additional gas from the additional gas supply unit 320 is provided on the additional gas supply line 308.

Further, a non-illustrated branch flow controller (flow splitter) is provided at a junction point between the first and second branch lines 304 and 306 to adjust branch flows within the first and second branch lines 304 and 306 based on internal pressures of the first and second branch lines 304 and 306.

The processing gas supply unit 310 may include a single gas supply source or may include a multiple number of gas supply sources. If it includes a single gas supply source, a line of the single gas supply source is directly connected to the processing gas supply line 302. If the processing gas supply unit 310 includes the multiple number of gas supply sources, on the other hand, individual lines of those gas supply sources are connected to the processing gas supply line 302 such that gases flowing in the individual lines join each other. An opening/closing valve for turning on and off the supply of a gas and a mass flow controller for controlling a flow rate of the gas are provided on each of the lines of the individual gas supply sources.

With this processing gas supply unit 310, a gas from the single gas supply source or gases from the multiple number gas supply sources flows into the processing gas supply line 302 at a certain flow rate or at a certain flow rate ratio. The gas supply source of the processing gas supply unit 310 may be configured to supply a fluorocarbon-based fluorine compound $C_XF_Y$ such as $CF_4$, $C_4F_6$, $C_4F_8$, $C_5F_8$ as an etching gas. Further, the gas supply source of the processing gas supply unit 310 may further include a gas, such as an $O_2$ gas, for controlling deposition of a CF-based reaction product; a rare gas (e.g., an Ar gas) as a carrier gas; and so forth.

The additional gas supply unit 320 may include a single gas supply source or a multiple number of gas supply sources that are independent from the gas supply source of the processing gas supply unit 310. If the additional gas supply unit 320 includes a single gas supply source, a line of the single gas supply source is directly connected to the additional gas supply line 308. If the additional gas supply unit 320 includes the multiple number of gas supply sources, on the other hand, individual lines of those gas supply sources are connected to the additional gas supply line 308 such chat gases flowing in the individual lines join each other. An opening/closing valve for turning on and off the supply of a gas and a mass flow controller for controlling a flow rate of the gas are provided on each of the lines of the individual gas supply sources.

With this additional gas supply unit 320, a gas from the single gas supply source or gases from the multiple number gas supply sources flows into the additional gas supply line 303 at a certain flow rate or at a certain flow rate ratio and, then, supplied into the second branch line 306. Further, the gas supply source of the additional gas supply unit 320 may be configured to supply the same kind of gas as that of the processing gas supply unit 310 or different kinds of gases.

With the gas supply device 300 having the above-described configuration, the processing gas from the processing gas supply unit 310 is split into the center gas and the edge gas by the first branch line 304 and the second branch line 306. At this time, if the branch flow controller (e.g., flow splitter) is provided, the branch flows of the center and edge gases are adjusted by the branch flow controller.

The processing gas branched into the first branch line 304 is introduced into the center buffer room 222 as the center gas, and the processing gas branched into the second branch line 306 is introduced into the edge buffer room 224 as the edge gas.

At this time, if an additional gas is supplied from the additional gas supply unit 320, the additional gas is mixed with the processing gas in the second branch line 306 after passing through additional gas supply line 308.

Then, the center gas introduced into the center buffer room 222 is discharged toward the center region of the wafer W through the gas holes 212, and the edge gas introduced into the edge buffer room 224 is discharged toward the edge region of the wafer W through the gas holes 214. Accordingly, it is possible to locally control a process on the edge region of the wafer W with respect to the center region of the wafer W.

Here, the gases supplied into the processing chamber 102 through the gas holes 212 and 214 may be diffused downward. Thus, depending on positions of the edge gas discharging openings, the edge gas discharged from the edge gas discharging openings may be diffused to the center region of the wafer W. In such a case, the edge region of the wafer w may not be locally controlled.

Accordingly, in accordance with the present illustrative embodiment, by providing the edge gas discharging position adjusting unit and adjusting the positions of the edge gas discharging openings, it is possible to control a diffusion state of the edge gas. As a result, it is possible to suppress the diffusion of the edge gas to the center region of the wafer W. Such an edge gas discharging position adjusting unit may be configured to adjust the vertical position and/or the horizontal position of the edge gas discharging openings.

In the upper electrode 200 shown in FIG. 1, an example edge gas discharging position adjusting unit configured to adjust the vertical position of the edge gas discharging openings is illustrated. To elaborate, the gas hole formation plate 230 having the gas holes 232 communicating with the gas holes 214 of the edge gas inlet section 206 is provided at the bottom surface of the edge gas inlet section 206. The gas hole formation plate 230 is made of, for example, an annular plate-shaped, member as shown in FIG. 1 not to block the gas flow of the center gas inlet section 204.

With this configuration, by adjusting the thickness of the gas hole formation plate 230, the edge gas discharging openings can be moved downward as much as the thickness of the gas hole formation plate 230. Accordingly, the distance between the edge gas discharging openings and the wafer W can be shortened, so that the edge gas can be suppressed, from being diffused toward the center region of the wafer W.

(Relationship Between Positions of Edge Gas Discharging Openings and Diffusion State)

Figure 2:
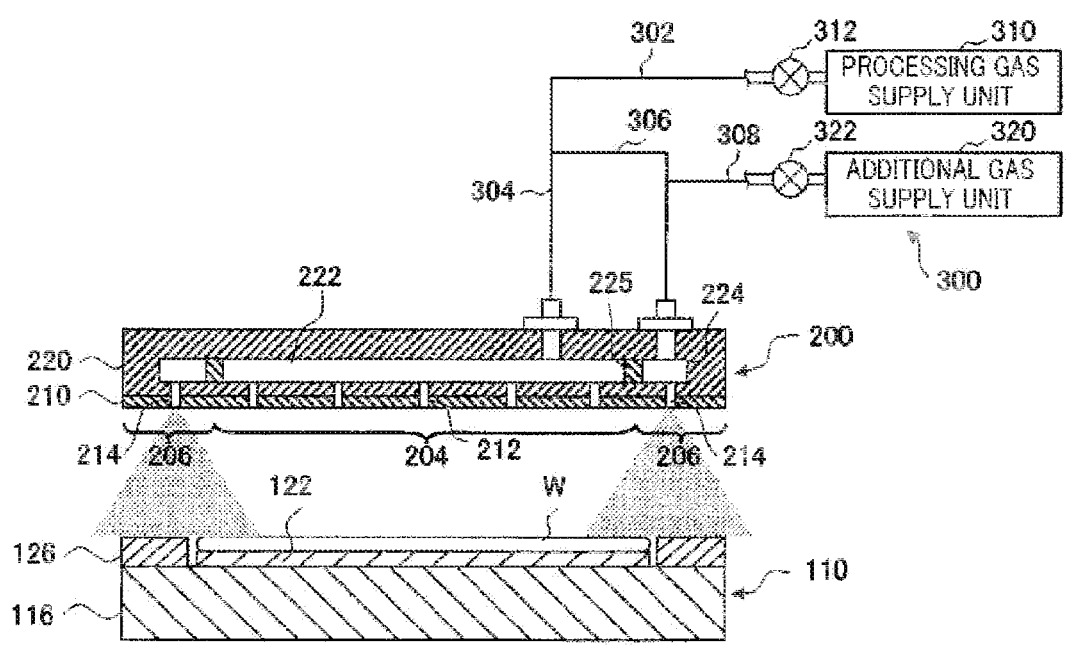
FIG. 2 is a cross sectional view schematically illustrating a configuration of an upper electrode in accordance with a comparative example.
Figure 3:
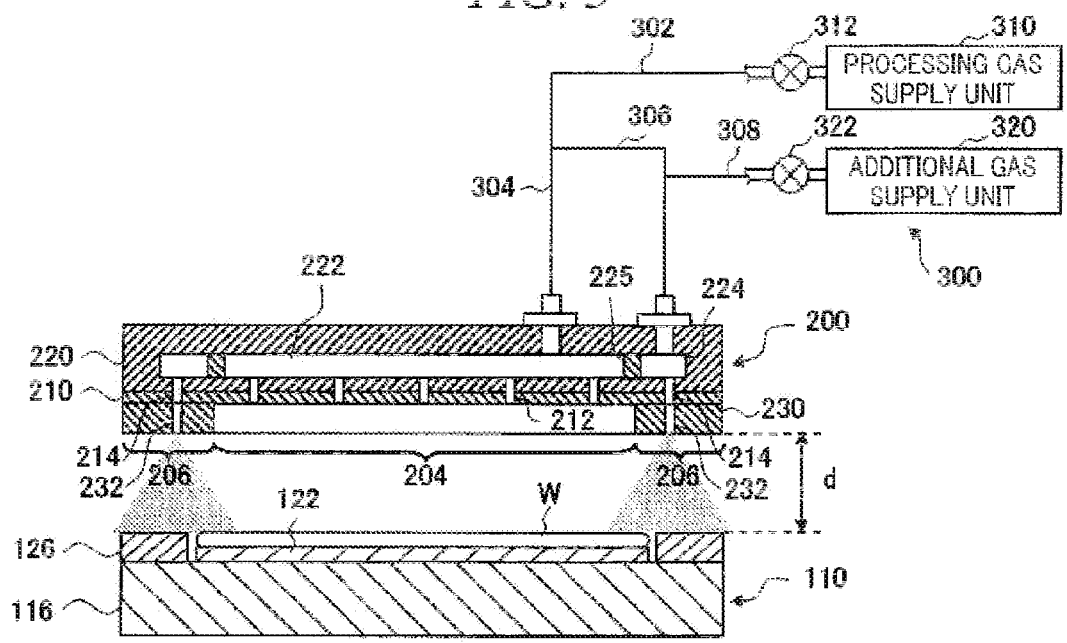
FIG. 3 is a cross sectional view schematically illustrating a configuration of an upper electrode in accordance with the first illustrative embodiment.

Hereinafter, a relationship between the positions of the edge gas discharging openings and diffusion state will be explained in detail in comparison with a comparative example shown in FIG. 2. FIG. 2 is a diagram for describing an upper electrode in accordance with the comparative example and illustrates a configuration in which a gas hole formation plate 230 is not provided. FIG. 3 is a diagram for describing the upper electrode in accordance with the present illustrative embodiment and illustrates a configuration in which the gas hole formation plate 230 is provided. FIG. 3 is a diagram corresponding to FIG. 2 and schematically illustrates a configuration of the upper electrode and the lower electrode shown in FIG. 1.

Since an upper electrode 200 in accordance with the comparative example shown in FIG. 2 does not have a gas hole formation plate 230, center gas discharging openings (outlets of gas holes 212) and edge gas discharging openings (outlets of gas holes 214) are all formed on the same plane, i.e., on a flat bottom surface of an electrode plate 210. Since an edge gas is diffused until it reaches the wafer W, as the edge gas discharging openings are more closely located to the center gas discharging openings in this configuration, diffusion of the edge gas toward the center region of the wafer becomes increased.

In contrast, in the upper electrode 200 in accordance with the present illustrative embodiment shown in FIG. 3, by providing the gas hole formation plate 230 having the gas holes 232 communicating with the gas holes 214, outlets of the gas holes 232 serve as edge gas discharging openings. Thus, the edge gas discharging openings are moved to the bottom surface of the gas hole formation plate 230. Accordingly, the vertical position of the edge gas discharging openings can be located lower than those of the center gas positions as much as the thickness of the gas hole formation plate 230. With this configuration, the distance d between the edge gas discharging openings and the wafer W can be shortened. Accordingly, the edge gas can reach the wafer W before it is diffused too widely. In this way, diffusion of the edge gas can be suppressed, and the edge gas can be suppressed from being diffused toward the center region of the wafer W.

In the upper electrode 200 shown in FIG. 3, the gas hole formation plate 230 is detachable provided at the bottom surface of the edge gas inlet section 206 (here, the bottom surface of the electrode plate 210) by a fastening member such as bolts or screws. Accordingly, by using gas hole formation plates 230 having different thicknesses and by replacing them, vertical position of the edge gas discharging openings can be adjusted as much as the thicknesses of the gas hole formation plates 230.

Further, in FIG. 3, although the gas holes 232 of the gas hole formation plate 230 are formed to have the same diameter as that of the gas holes 214 of the electrode plate 210 and the centers of the gas holes 232 coincide with the centers of the gas holes 214 of the electrode plate 210, the illustrative embodiment is not limited thereto. The diameter of the gas holes 232 of the gas hole formation plate 230 may be set to be smaller than the diameter of the gas holes 214 of the electrode plate 210. In such a case, since the discharging rate of the edge gas increases, diffusion of the edge gas can be suppressed. As a result, the edge gas can be suppressed from being diffused more efficiently.

Now, an experimental result of investigating an effect of varying vertical position of edge gas discharging openings will be explained with reference to FIGS. 4 and 5. In this experiment, by performing an etching process on an oxide film formed on a wafer W while varying a distance between the edge gas discharging openings and the wafer W, a variation in the gas diffusion state from the edge gas discharging openings is detected based on a variation in an etching rate of the oxide film.

In this experiment, in order to obtain an experimental result only by an edge gas while removing influence of a center gas, the upper electrode 200 in which the center gas discharging openings and the edge gas discharging openings are formed on the same plane as shown in FIG. 2 is used. That is, when setting a distance (GAP) between the bottom surface (where the discharging openings are located) of the electrode plate 210 and the wafer W to be about 50 mm, about 40 mm, about 30 mm and about 22 mm, an etching rate A of the oxide film and an etching rate B of the oxide film are detected, respectively. Here, the etching rate A is detected when an etching gas is discharged only from the center gas discharging openings, and the etching rate B is detected when the etching gas is discharged from both the center gas discharging openings and the edge gas discharging openings at the same flow rates (at a flow ratio of about 1:1).

For each of the GAPs (about 50 mm, about 40 mm, about 30 mm and about 22 mm), by subtracting the etching rate A (only by the center gas) from the etching rate B (by both the center gas and the edge gas), an etching rate C of the oxide film is calculated, which indicates a diffusion state of the gas discharged only from the edge gas discharging openings.

Figure 4:
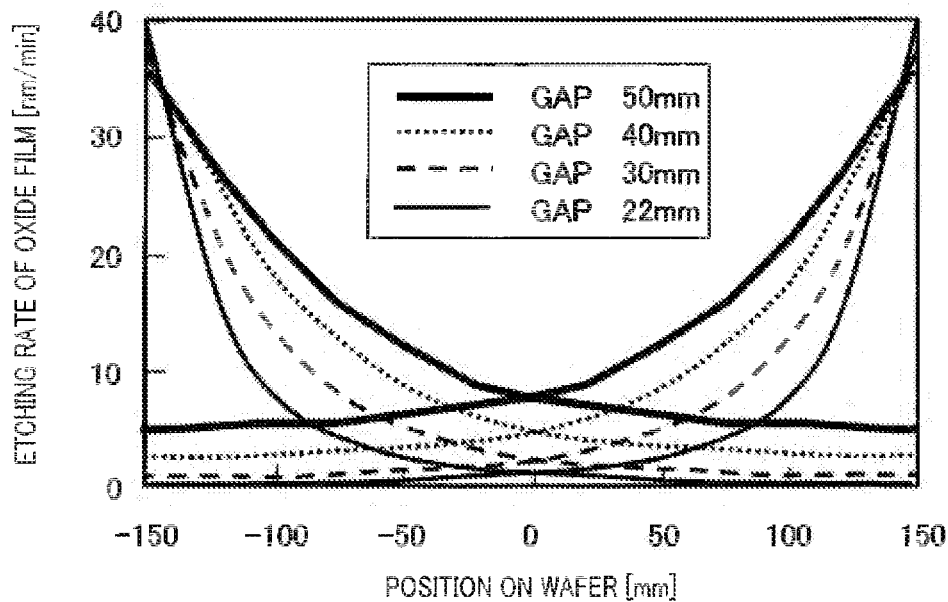
FIG. 4 is a graph showing an experimental result for investigating an effect when a vertical position of an edge gas discharging opening is changed.

FIG. 4 is a graph obtained by performing a curve fitting of the etching rates C of the oxide film through a certain diffusion equation. Here, the curve fitting is performed by assuming that, using a wafer W having a diameter of about 300 mm, edge gas discharging openings are positioned directly above a position of about −150 mm and about +150 mm on the wafer W with respect to a center of the wafer W set as zero (0). The diffusion equation is expressed as Eq. (1).

In Eq. (1), f(x) is obtained by performing a curve fitting of the diffusion state of the gas discharged from edge gas discharging openings positioned directly above the position of about −150 mm on the wafer W, as shown in Eq. (2). In Eq. (1), g(x) is obtained by performing a curve fitting of the diffusion state of the gas discharged from edge gas discharging openings positioned directly above the position of about +150 mm on the wafer W, as depicted in Eq. (3). In Eq. (2) and Eq. (3), a and b represent integers.

$$y = f(x) + g(x) \qquad \text{Eq. (1)}$$

$$f(x) = a \times \exp(-(x+150)/b) \qquad \text{Eq. (2)}$$

$$g(x) = a \times \exp(-(x-150)/b) \qquad \text{Eq. (3)}$$

Figure 5:
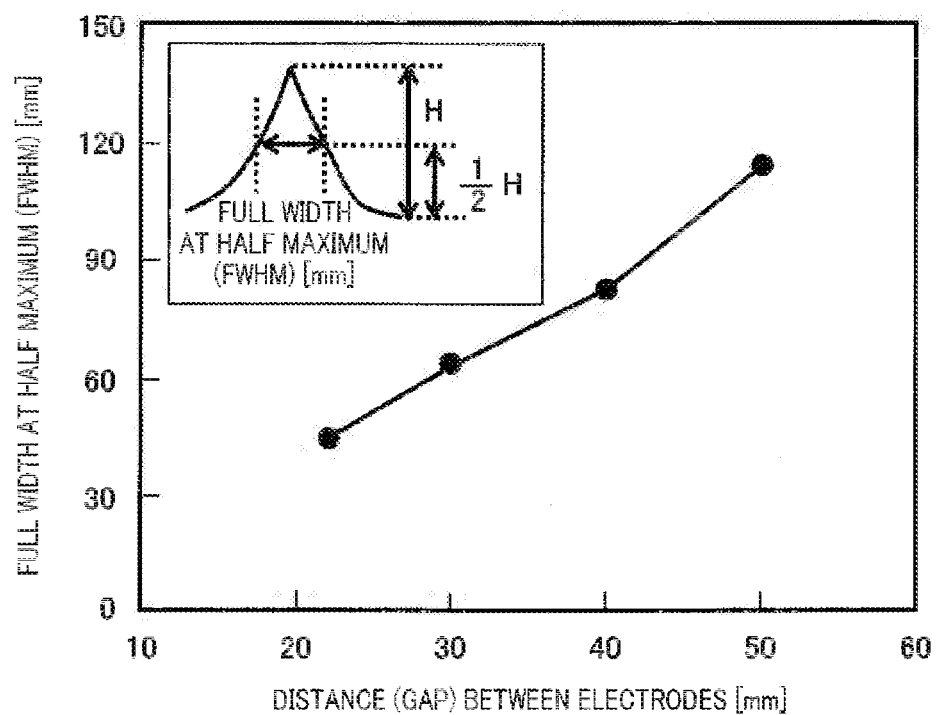
FIG. 5 is a graph showing a full width at half maximum calculated for the curve on the graph of FIG. 4 and indicates the degree of gas diffusion.

Further, for more clear understanding of the variation by each of the GAPs in FIG. 4, FIG. 5 provides a graph by calculating FWHM (Full Width at Half Maximum) values for the curve of the etching rate for each GAP. In FIG. 5, the curve fitting (e.g., f(x)) is performed on the diffusion state of the gas discharged from one of the edge gas discharging openings through the diffusion equation. To elaborate, the graph of FIG. 5 is obtained by plotting widths (full widths at half maximums) at ½ heights of peak heights H of the curve obtained by performing the curve fitting. Accordingly, in FIG. 5, as the FWHM value is smaller, it implies that the gas diffusion is suppressed.

According to the experimental result provided in FIG. 4, as the distance (GAP) between the edge gas discharging openings and the wafer W decreases from about 50 mm to about 40 mm, about 30 mm and about 22 mm, the etching rate at the center region of the wafer W is decreased. In FIG. 5, as the distance (GAP) between the edge gas discharging openings and the wafer W decreases, the FWHM value is also decreased. From these results, it is found out that as the distance (GAP) between the edge gas discharging openings and the wafer W decreases, the gas diffusion coward the center region of the wafer W can be suppressed.

As described above, in accordance with the present illustrative embodiment, as illustrated in FIGS. 1 and 3, by disposing the gas hole formation plate 230 on the bottom surface of the edge gas inlet section 206 and adjusting the vertical position of the edge gas discharging openings, the edge gas can be suppressed from being diffused toward the center region of the wafer W. Accordingly, when locally controlling a process on the edge region of the wafer W with respect to the center region of the wafer W, controllability can be improved.

Figure 6A:
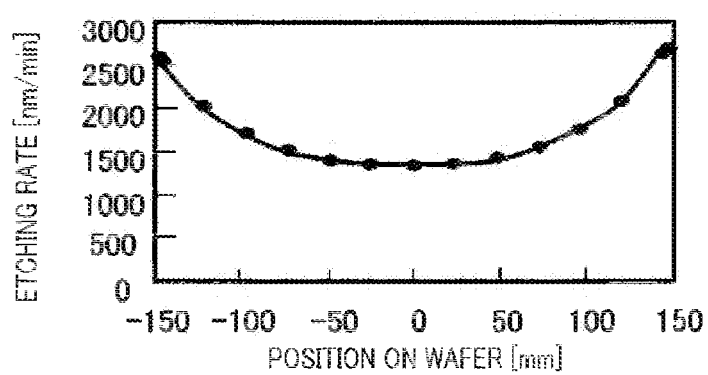
FIG. 6A is a graph showing an etching rate when only a processing gas including an etching gas is introduced in the first illustrative embodiment.

By way of example, when a target film on the wafer W is etched by supplying an etching gas having low deposition property from the processing gas supply unit 310 as a processing gas, if an etching rate at the edge region of the wafer W tends to be higher than an etching rate at the center region of the wafer W, as illustrated in FIG. 6A, a deposition gas having high deposition property is supplied from the additional gas supply unit 320 to the edge region of the wafer W as an additional gas.

Figure 6B:
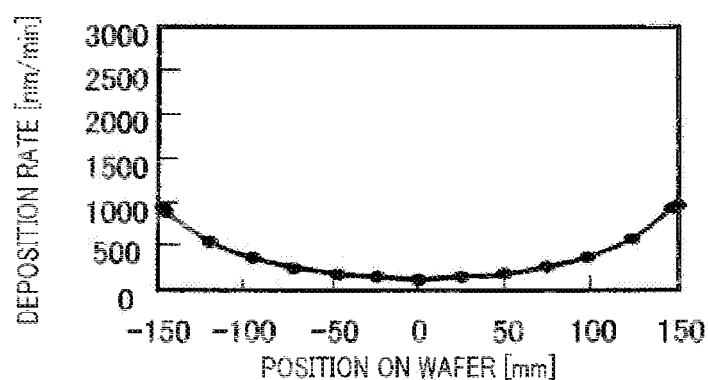
FIG. 6B is a graph showing a deposition rate when only an additional gas including a deposition gas is introduced in the first illustrative embodiment.
Figure 6C:
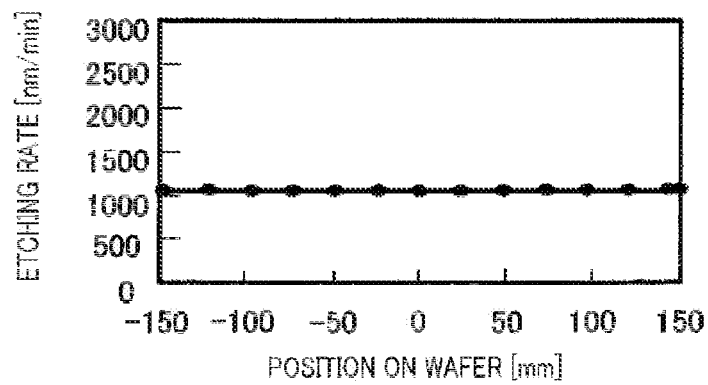
FIG. 6C is a graph showing an etching rate when the etching gas of FIG. 6A and the deposition gas of FIG. 6B are introduced in the first illustrative embodiment.

At this time, by lowering the vertical position of the edge gas discharging openings through the gas hole formation plate 230, the distance between the edge gas discharging openings and the wafer W can be shortened. As a result, the gas diffusion to the center region of the wafer W can be suppressed. Accordingly, as shown in FIG. 6B, it is possible to control a deposition rate at the edge region of the wafer W to become higher than a deposition rate at the center region of the wafer W with high controllability. As a result, as shown in FIG. 6C, the etching rates at the center region and the edge region of the wafer W can be substantially same, so that process uniformity in the entire surface of the wafer W can be improved.

(Modification Example of First Illustrative Embodiment)

Figure 7:
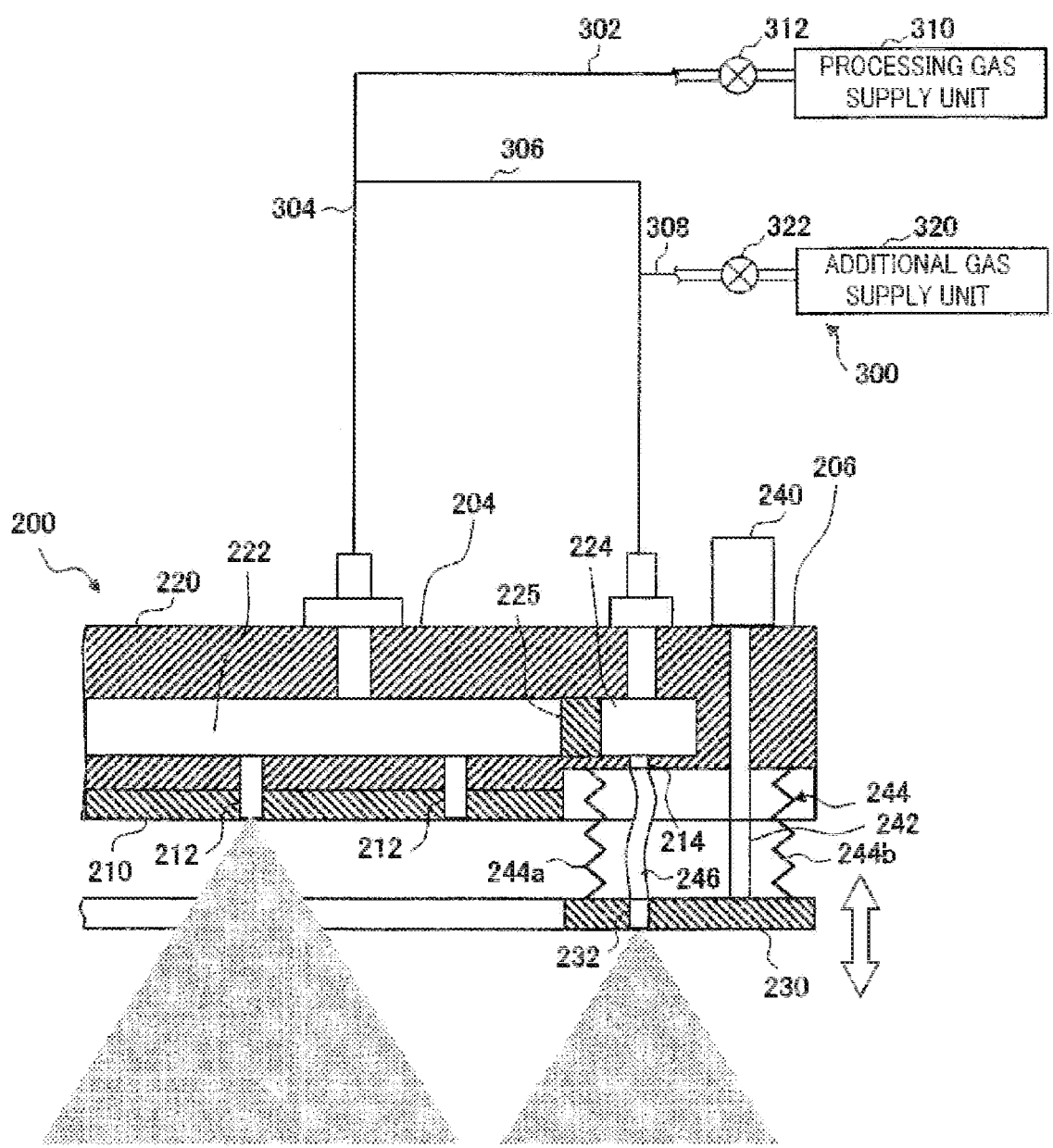
FIG. 7 is a cross sectional view illustrating a modification example of the upper electrode shown in FIG. 3.

Now, a modification example of the first illustrative embodiment will be explained with reference to the accompanying drawings. FIG. 7 is a cross sectional view illustrating a configuration of an upper electrode 200 in accordance with the modification example of the present illustrative embodiment. FIGS. 1 and 3 has been described when the gas hole formation plate 230 is detachably provided at the bottom surface of the edge gas inlet section 206 as the edge gas discharging position adjusting unit. In this modification example, the gas hole formation plate 230 is configured to be vertically movable.

In the upper electrode 200 shown in FIG. 7, an electrode plate 210 provided on a bottom surface of a center gas inlet section 204 is formed to have the substantially same size as that of the center gas inlet section 204. A gas hole formation plate 230 is provided at a bottom surface of an edge gas inlet section 206 (bottom surface of an electrode supporting member 220) to be vertically movable.

The gas hole formation plate 230 is supported on the bottom surface of the edge gas inlet section 206 by a bellows 244. The bellows 244 includes a small-diameter bellows 244a and a large-diameter bellows 244b that are concentrically arranged. Upper ends of the small-diameter bellows 244a and the large-diameter bellows 244b are fastened to the bottom surface of the electrode supporting member 220, while lower ends thereof are fastened to a top surface of the gas hole formation plate 230. With this configuration, a space within the bellows 244 above the gas hole formation plate 230 (i.e., a space between the small-diameter bellows 244a and the large-diameter bellows 244b) can be isolated from the external space.

In the space within the bellows 244, there are provided flexible tubes 246 that allow the gas holes of the gas hole formation plate 230 to communicate with corresponding gas holes 214 of the edge gas inlet section 206. With this configuration, an edge gas is introduced into the flexible tubes 246 and discharged from the gas holes 232 of the gas hole formation plate 230.

An elevation driving unit is provided at the gas hole formation plate 230 to move the gas hole formation plate 230 up and down. The elevation driving unit may include, for example, a motor 240 having a vertically movable rod 242, as shown in FIG. 7. In this case, the motor 240 is fastened to the electrode supporting member 220, and the rod 242 is protruded downward from the motor 240 through the electrode supporting member 220 and placed within the bellows 244. The gas hole formation plate 230 is connected with a leading end of the rod 242. The elevation driving unit may not be limited to the example shown in FIG. 7. By way of non-limiting example, an air cylinder may be used as the elevation driving unit.

As illustrated in FIG. 7, when providing the gas hole formation plate 230 on the bottom surface of the electrode supporting member 220, a lower portion of the electrode supporting member 220 corresponding to the edge gas inlet section 206 may be cut away to form a space in which the bellows 244 or the flexible tubes 246 are accommodated when the bellows 244 is contracted.

Further, in FIG. 7, although the flexible tubes 246 are illustrated as tubes that allow the gas holes 232 of the gas hole formation plate 230 to communicate with the gas holes 214 of the edge gas inlet section 206, for example, the illustrative embodiment is not limited thereto. By way of example, other types of tubes may be used as long as the tubes are flexible when the bellows 244 is extended and contracted by moving up and down the gas hole formation plate 230.

Figure 8A:
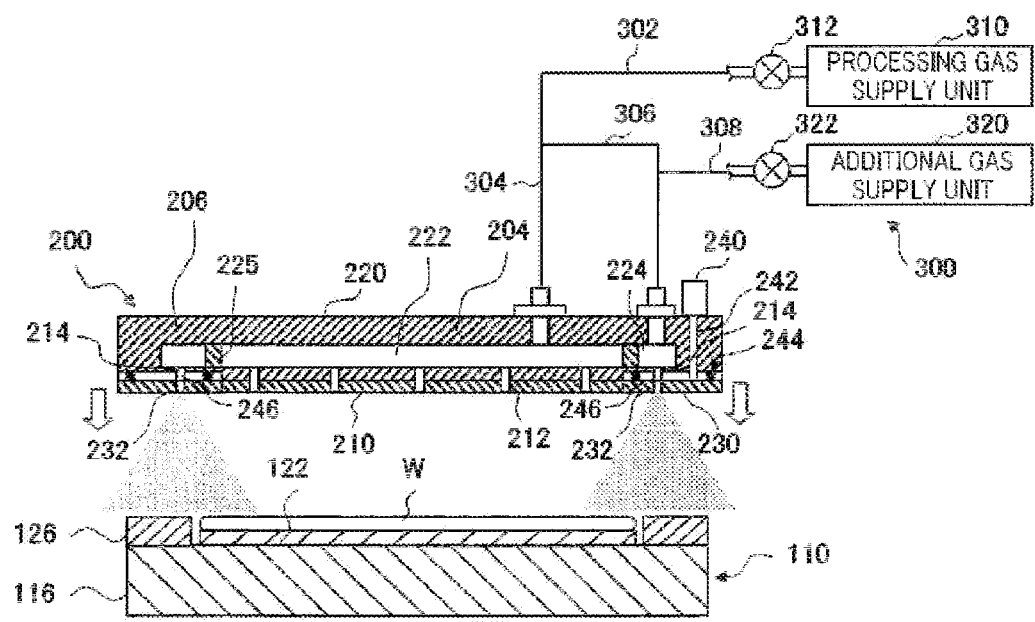
FIG. 8A is a diagram for describing an operation of the upper electrode shown in FIG. 7 in a configuration where a gas hole formation plate is positioned at an upper position.
Figure 8B:
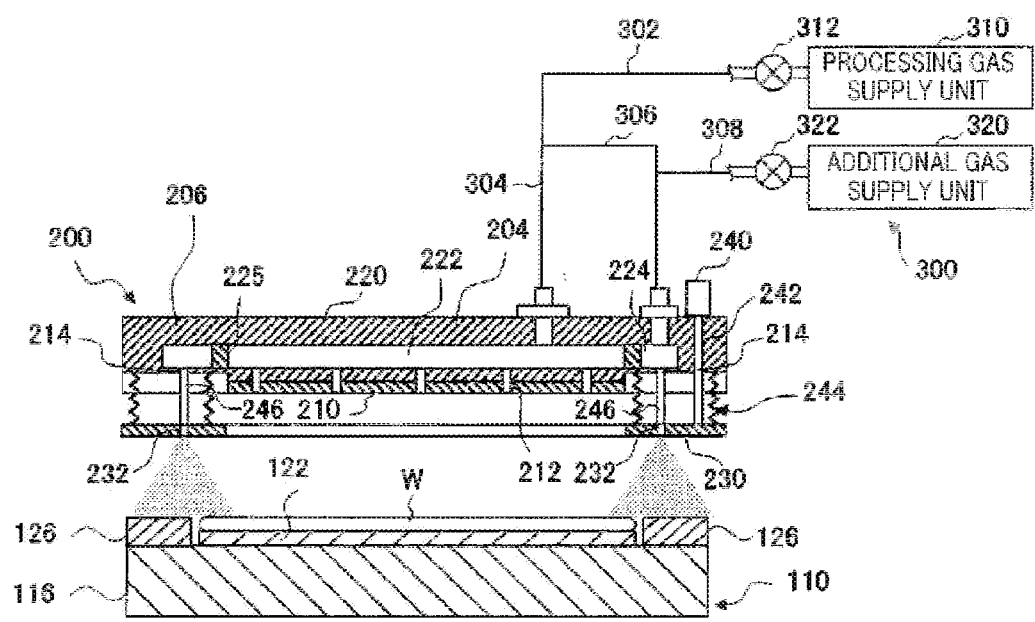
FIG. 8B is a diagram for describing an operation of the upper electrode shown in FIG. 7 in a configuration where the gas hole formation plate is moved to a lower position.

Now, an operation of the upper electrode 200 of FIG. 7 having the above-described configuration will be described with reference to the accompanying drawings. FIGS. 8A and 8B are diagram for describing the operations. In FIG. 8A, the gas hole formation plate 230 is located at an upper position. At this position, the edge gas discharging openings are located on she same plane as the center gas discharging openings. Accordingly, the edge gas is diffused like the center gas, and reaches the wafer W.

If the gas hole formation plate 230 is moved downward from the position shown in FIG. 8A by driving the motor 240 under the control of the controller 150, the edge gas discharging openings can be moved down, as illustrated in FIG. 8B. Accordingly, the edge gas can reach the wafer W while diffusion of the edge gas to the center region of the wafer W is suppressed. Thus, the edge gas can be suppressed from being diffused to the center region of the wafer W.

As stated above, in the upper electrode 200 shown in FIG. 7, the gas hole formation plate 230 can be moved up and down by the motor 240. Accordingly, the vertical position of the edge gas discharging openings can be adjusted as required.

Here, the gas hole formation plate 230 may be made of the same material (e.g., a silicon-containing material such as quartz (SiO$_2$), SiC or SiN) as that of the electrode plate 210 of the center gas inlet section 204, or may be made of a different material (e.g., alumina or yttrium) from that of the electrode plate 210. Further, the gas hole formation plate 230 may be used as an electrode plate 210 of she edge gas inlet section 206. In such a case, it is desirable that the gas hole formation plate 230 may be made of the same material as that of the electrode plate 210 of the center gas inlet section 204.

Second Illustrative Embodiment

Now, a second illustrative embodiment will be explained with reference to the accompanying drawings. Here, an example of an edge gas discharging position adjusting unit configured to adjust a horizontal position of edge gas discharging openings will be explained. FIG. 9 is a cross sectional view illustrating a configuration of an upper electrode of a substrate processing apparatus in accordance with the second illustrative embodiment.

In this illustrative embodiment, the edge gas discharging position adjusting unit may include multiple rows of gas holes, and the rows of gas holes are annularly provided in an edge gas inlet section 206 from the inner side of the edge gas inlet section 206 toward the outer side thereof. By selecting one or more row of gas holes, the edge gas can be supplied through a selected row of gas holes. With this configuration, by adjusting the horizontal position of the edge gas discharging openings, it is possible to discharge the edge gas from discharging openings located at a more outer position.

In the upper electrode 200 shown in FIG. 9, three rows of gas holes 214a, 214b and 214c are formed in the edge gas inlet section 206 from the inner side toward the outer side thereof. The gas holes 214a, 214b and 214c in respective rows are annularly arranged. Further, the number of rows of the gas holes formed in the edge gas inset section 206 may not be limited to three, as in FIG. 9, but it may be two or more than three.

The gas holes 214a, 214b and 214c communicate with edge buffer rooms 224a, 224b and 224c corresponding to the rows of the gas holes 214a, 214b and 214c, respectively. The edge buffer rooms 224a, 224b and 224c are formed around a center buffer room 222 while isolated from each other. An edge gas can be independently supplied into the edge buffer rooms 224a, 224b and 224c, and it is also possible to select edge gases to be supplied into the respective edge buffer rooms 224a, 224b and 224c.

To elaborate, as illustrated in FIG. 9, a second branch line 306 is branched into branch lines 306a, 306b and 306c, and these three branch lines 306a, 306b and 306c are connected to the edge buffer rooms 224a, 224b and 224c, respectively. Opening/closing valves 307a, 307b and 307c are provided on the branch lines 306a, 306b and 306c, respectively. By opening/closing the opening/closing valves 307a, 307b and 307c, the edge buffer rooms 224a, 224b and 224c into which the edge gas is supplied can be selected.

Moreover, the edge buffer rooms 224a, 224b and 224c may be formed by partitioning a single circular plate-shaped space through annular partition wall members 225a, 225b and 225c, as shown in FIG. 9, or may be formed as separate spaces.

Figure 10A:
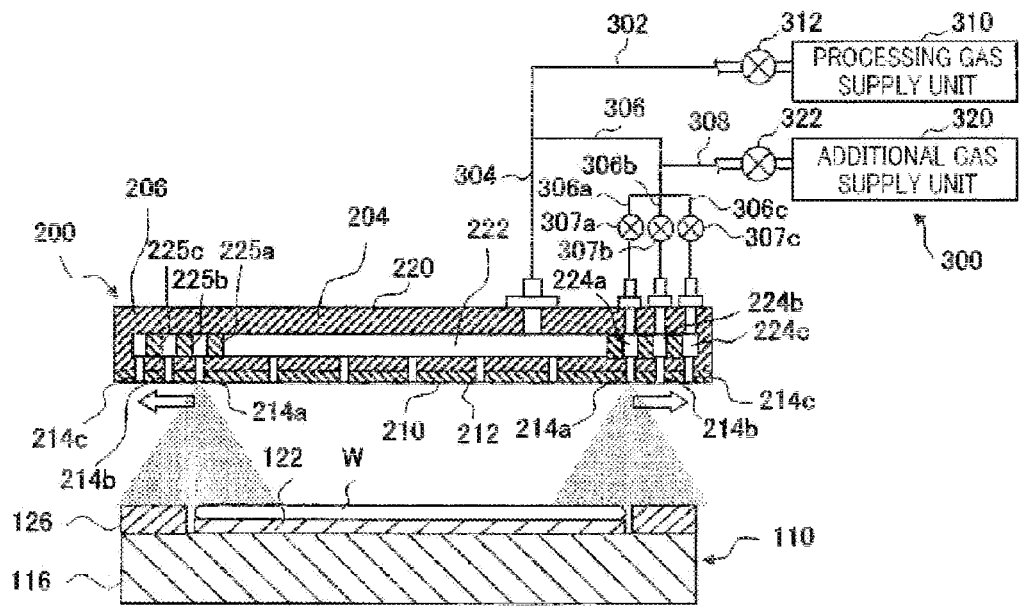
FIG. 10A is a diagram for describing an operation of the upper electrode shown in FIG. 9 when an edge gas is discharged from the innermost gas holes.
Figure 10B:
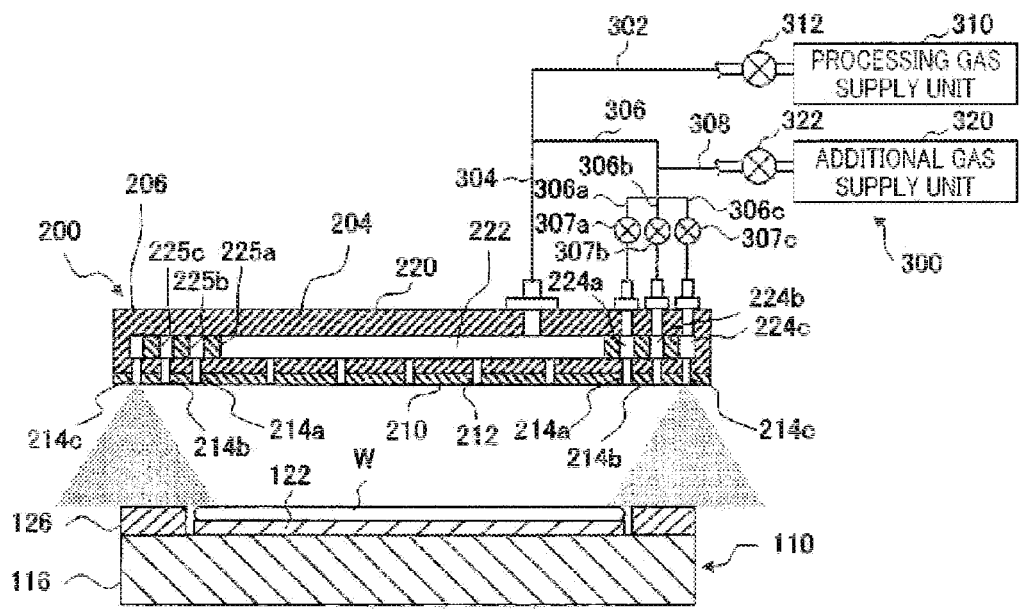
FIG. 10B is a diagram for describing an operation of the upper electrode shown in FIG. 9 when an edge gas is discharged from the outermost gas holes.

An operation of the upper electrode 200 of FIG. 9 having the above-described configuration will be explained with reference to the accompanying drawings. FIGS. 10A and 10B are cross sectional views for illustrating an operation of the upper electrode shown in FIG. 9. FIG. 10A illustrates a case in which an edge gas is discharged from the innermost gas holes 214a, and FIG. 10B illustrates a case in which the edge gas is discharged from the outermost gas holes 214c.

As depicted in FIG. 10A, when discharging the edge gas from the gas holes 214a, the opening/closing valves 307b and 307c are closed while the opening/closing valve 307a is opened under the control of a controller 150. Accordingly, the gas from the second branch line 306 is supplied into and diffused in the edge buffer room 224a via the branch line 306a and then is discharged from the gas holes 214a.

As shown in FIG. 10B, when discharging the edge gas from the gas holes 214c, the opening/closing valves 307a and 307b are closed while the opening/closing valve 307c is opened under the control of the controller 150. Accordingly, the gas from the second branch line 306 is supplied into and diffused in the edge buffer room 224c via the branch line 306c and then is discharged from the as the gas holes 214c. Further, though not shown, when discharging the edge gas from the gas holes 214b, the opening/closing valves 307a and 307c are closed while the opening/closing valve 307b is opened under the control of the controller 150.

As stated above, in the upper electrode 200 shown in FIG. 9, by opening and closing the opening/closing valves 307a, 307b and 307c through the controller 150, one of the edge buffer rooms 224a, 224b and 224c into which the edge gas is to be supplied is selected. Accordingly, it is possible to select one or more of the rows of the gas holes 214a, 214b and 214c and discharge the edge gas from the selected row of gas holes 214a, 214b and 214c.

In this way, since the horizontal position of the edge gas discharging openings can be adjusted, the edge gas can be suppressed from being diffused to the center region of a wafer W. In this illustrative embodiment, by discharging the edge gas from more outer gas holes, the edge gas can be more suppressed from being diffused to the center region of the wafer W. Accordingly, when locally controlling a process on an edge region of the wafer W with respect to the center region of the wafer W, controllability can be improved.

Furthermore, the edge gas discharging position adjusting unit in the first illustrative embodiment is configured to adjust only the vertical position of the edge gas discharging openings, and the edge gas discharging position adjusting unit in the second illustrative embodiment is configured to adjust only the horizontal position of the edge gas discharging openings. However, the illustrative embodiments are not limited thereto, and an edge gas discharging position adjusting unit may be configured to adjust both the vertical position and the horizontal position of edge gas discharging openings, as illustrated in FIGS. 11 and 12.

Figure 11:
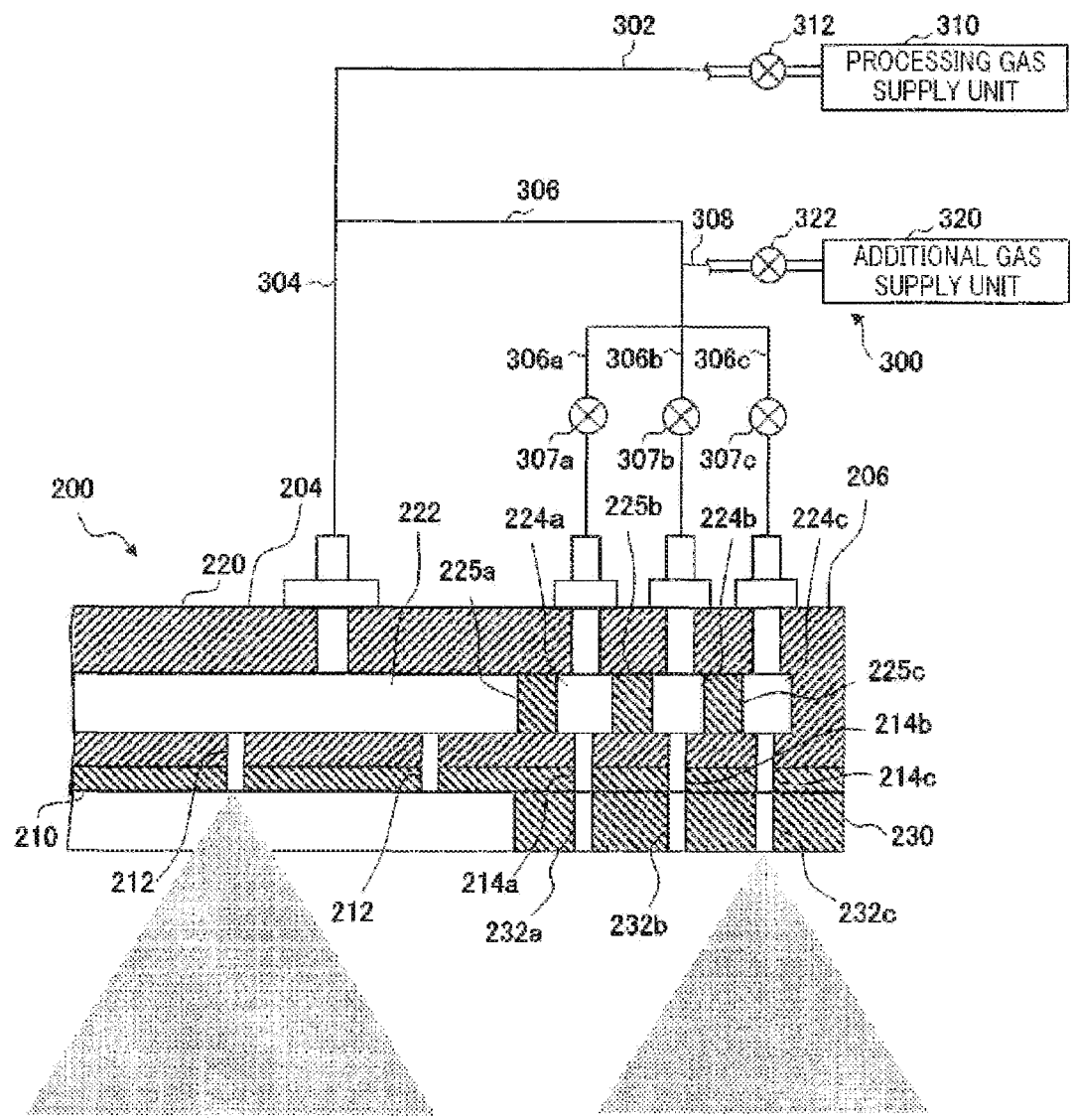
FIG. 11 is a cross sectional view illustrating a modification example of the upper electrode shown in FIG. 9.

In an upper electrode 200 shown in FIG. 11, the gas hole formation plate 230 as shown in FIG. 3 for adjusting the vertical position of the edge gas discharging openings is applied to the edge gas inlet section 200 shown in FIG. 9 configured to adjust the horizontal position of the edge gas discharging openings.

To elaborate, as depicted in FIG. 11, gas holes 232a, 232b and 232c corresponding to gas holes 214a, 214b and 214c of an edge gas inlet section 206 respectively are formed in a gas hole formation plate 230. The gas hole formation plate 230 is provided at a bottom surface of the edge gas inlet section 206 (i.e., a bottom surface of an electrode plate 210) such that the gas holes 232a, 232b and 232c communicate with the gas holes 214a, 214b and 214c, respectively. In accordance with the upper electrode 200 shown in FIG. 11, the horizontal position of the edge gas discharging openings can be adjusted, and, at the same time, the vertical position of the edge gas discharging openings can also be adjusted by varying the thickness of the gas hole formation plate 230.

In an upper electrode 200 shown in FIG. 12, the gas hole formation plate 230 shown in FIG. 7 for adjusting the vertical position of the edge gas discharging openings is applied to the edge gas inlet section 206 shown in FIG. 9 configured to adjust the horizontal position of the edge gas discharging openings.

To elaborate, as depicted in FIG. 12, gas holes 232a, 232b and 232c corresponding to gas holes 214a, 214b and 214c of an edge gas inlet section 206 respectively are formed in a gas hole formation plate 230. An electrode plate 210 on a bottom surface of a center gas inlet section 204 is formed to have the substantially same size as that of the center gas inlet section 204. The gas hole formation plate 230 is provided at a bottom surface of the edge gas inlet section 206 (i.e., a bottom surface of an electrode supporting member 220) via a bellows 244 to be vertically movable. The configurations of the bellows 244 and an elevation driving unit of the gas hole formation plate 230 are the same as shown in FIG. 7.

In a space within the bellows 244, there are provided flexible tubes 246a, 246b and 246c that allow the gas holes 232a, 232b and 232c of the gas hole formation plate 230 to communicate with the gas holes 214a, 214b and 214c of the edge gas inlet section 206 corresponding to the gas holes 232a, 232b and 232c, respectively. With this configuration, an edge gas is introduced into the flexible tubes 246a, 246b and 246c and then is discharged from one or more of the rows of gas holes 232a, 232b and 232c of the gas hole formation plate 230. In accordance with the upper electrode 200 shown in FIG. 12, the horizontal position of the edge gas discharging openings can be adjusted, and, at the same time, the vertical position of the edge gas discharging openings can also be adjusted by vertically moving the gas hole formation plate 230.

Further, although the above-described illustrative embodiments have been described when forming the gas holes for the edge gas serving as the edge gas discharging openings and the gas holes for the center gas serving as the center gas discharging openings to have the same diameter, the illustrative embodiments are not limited thereto. By way of example, the diameter of the gas holes for the edge gas may be formed to be smaller than the diameter of the gas holes for the center gas. With this configuration, a diffusing range of the edge gas can be decreased as compared to a diffusing range of the center gas. Thus, in the above-described illustrative embodiments, the edge gas can be suppressed from being diffused to the center region of the wafer W more efficiently. As a result, controllability of a process on the edge region of the wafer W can be further improved.

Moreover, in the above-described illustrative embodiments, although the gas holes for the edge gas and the gas holes for the center gas are vertically formed, respectively, the illustrative embodiments may not be limited thereto. By way of example, only the gas holes for the edge gas may be formed to be inclined outward. In this configuration, since the edge gas can be discharged toward the more outer side, the edge gas can be suppressed from being diffused to the center region of the wafer W more efficiently. As a result, controllability of a process on the edge region of the wafer W can be further improved.

In addition, in the above-described illustrative embodiment, the gas supply device 300 is configured to supply a processing gas from the processing gas supply unit 310 into the center gas inlet section 204 and the edge gas inlet section 206 after splitting the processing gas. However, a processing gas may be supplied into the center gas inlet section 204 and the edge gas inlet section 206 independently without being split. In such a case, two processing gas supply units 310 may be provided to supply processing gases into the center gas inlet section 204 and the edge gas inlet section 206, respectively.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

By way of example, she above illustrative embodiments have been described for the plasma processing apparatus that generates plasma by applying dual high frequency powers only to the lower electrode. However, the illustrative embodiments are not limited thereto but may be applied to a plasma processing apparatus that generates plasma by applying a single high frequency power only to the lower electrode or that generates plasma by applying dual frequency powers to the upper electrode and the lower electrode respectively.

Furthermore, the illustrative embodiments are not limited to such parallel plate type capacitively coupled plasma processing apparatuses, but may be applied to other types of plasma processing apparatuses such as an inductively coupled plasma processing apparatus (ICP).

Besides the plasma processing apparatus, the illustrative embodiments may also be applicable to other various types of substrate processing apparatuses, such as a sputtering apparatus, a heat treatment apparatus and a film forming apparatus, having a configuration in which a gas is supplied to a center region and an edge region of a substrate individually.

The illustrative embodiments may be applicable to a substrate processing apparatus that performs a required process on a substrate within a processing chamber by supplying a gas to the substrate.

What is claimed is:
1. A substrate processing apparatus for performing a process on a substrate disposed within a processing chamber by supplying a gas to the substrate, the apparatus comprising:
a gas introducing unit configured to supply one kind of gas or different kinds of gases to a center region and an edge region of the substrate,
wherein the gas introducing unit comprises:
a center gas inlet section having a multiple number of gas holes for a center gas to be supplied toward the center region of the substrate;
an edge gas inlet section having a multiple number of gas holes for an edge gas to be supplied toward the edge region of the substrate and surrounding the center gas inlet section; and an edge gas discharging position adjusting unit configured to adjust a horizontal position or a vertical position from which the edge gas is discharged through the gas holes of the edge gas inlet section, the edge gas discharging position adjusting unit being a separate member from the edge gas inlet section, wherein the edge gas discharging position adjusting unit includes a multiple number of gas openings, the edge gas discharging position adjusting unit is disposed below the edge gas inlet section and is not disposed below the center gas inlet section, such that a bottom surface of the edge gas discharging position adjusting unit is located same as or lower than a bottom surface of the center gas inlet section, centers of the multiple number of gas openings coincide with centers of the multiple number of gas holes for the edge gas, and the center gas inlet section and the edge gas inlet section are formed as a single body.

2. The substrate processing apparatus of claim 1,
wherein the edge gas discharging position adjusting unit is configured to adjust a vertical position from which the edge gas is discharged by providing a gas hole formation plate having the gas openings communicating with the gas holes of the edge gas inlet section at a bottom surface of the edge gas inlet section.

3. The substrate processing apparatus of claim 2,
wherein the gas hole formation plate is detachably provided at the bottom surface of the edge gas inlet section, and the vertical position from which the edge gas is discharged is adjusted by replacing the gas hole formation plate with another gas hole formation plate having a different thickness.

4. The substrate processing apparatus of claim 2,
wherein the gas hole formation plate is provided at the bottom surface of the edge gas inlet section to be vertically movable, and the vertical position from which the edge gas is discharged is adjusted by vertically moving the gas hole formation plate.

5. The substrate processing apparatus of claim 1,
wherein the edge gas discharging position adjusting unit includes a multiple number of rows of the gas openings arranged in the edge gas discharging position adjusting unit from the inner side of the edge gas discharging position adjusting unit toward the outer side thereof, and the horizontal position from which the edge gas is discharged is adjusted by selecting a row of the gas openings.

6. A substrate processing apparatus for performing a process on a substrate mounted on a mounting table within a processing chamber by supplying a gas to the substrate, the apparatus comprising:
a gas introducing unit configured to supply one kind of gas or different kinds of gases to a center region and an edge region of the substrate,
wherein the gas introducing unit comprises:
a center gas inlet section having a multiple number of gas holes for a center gas to be supplied toward the center region of the substrate;

an edge gas inlet section having a multiple number of gas holes for an edge gas to be supplied toward the edge region of the substrate and surrounding the center gas inlet section; and an edge gas discharging position adjusting unit configured to adjust both a horizontal position and a vertical position from which the edge gas is discharged through the gas holes of the edge gas inlet section, the edge gas discharging position adjusting unit being a separate member from the edge gas inlet section, wherein the edge gas discharging position adjusting unit includes a multiple number of rows of gas openings, the horizontal position from which the edge gas is discharged is adjusted by selecting a row of the gas openings by opening or closing valves connected with processing gas supply lines for supplying the edge gas into the row of the gas openings, the edge gas discharging position adjusting unit is disposed below the edge gas inlet section and is not disposed below the center gas inlet section, such that a bottom surface of the edge gas discharging position adjusting unit is located same as or lower than a bottom surface of the center gas inlet section, centers of the gas openings coincide with centers of the multiple number of gas holes for the edge gas, and the center gas inlet section and the edge gas inlet section are formed as a single body.

7. The substrate processing apparatus of claim 6,
wherein the multiple number of rows of the gas openings are arranged in the edge gas discharging position adjusting unit from the inner side of the edge gas discharging position adjusting unit toward the outer side thereof, the edge gas discharging position adjusting unit also includes a gas hole formation plate having the gas openings respectively communicating with the gas holes of the edge gas inlet section, and the gas hole formation plate is provided at a bottom surface of the edge gas inlet section, and the edge gas discharging position adjusting unit is configured to adjust both a vertical position and a horizontal position from which the edge gas is discharged.

8. The substrate processing apparatus of claim 7,
wherein the gas hole formation plate is detachably provided at the bottom surface of the edge gas inlet section, and the vertical position of the edge gas discharging openings is adjusted by replacing the gas hole formation plate with another gas hole formation plate having a different thickness.

9. The substrate processing apparatus of claim 7,
wherein the gas hole formation plate is provided at the bottom surface of the edge gas inlet section to be vertically movable, and the vertical position from which the edge gas is discharged is adjusted by vertically moving the gas hole formation plate.

* * * * *